US011923628B2

(12) United States Patent
Martinis et al.

(10) Patent No.: US 11,923,628 B2
(45) Date of Patent: Mar. 5, 2024

(54) BUTT JOINT FLEX CIRCUIT BOARD INTERCONNECTION

(71) Applicant: Google LLC, Mountain View, CA (US)

(72) Inventors: John Martinis, Santa Barbara, CA (US); Bob Benjamin Buckley, Santa Barbara, CA (US); Xiaojun Trent Huang, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 247 days.

(21) Appl. No.: 17/476,755

(22) Filed: Sep. 16, 2021

(65) Prior Publication Data

US 2022/0085527 A1  Mar. 17, 2022

Related U.S. Application Data

(60) Provisional application No. 63/079,267, filed on Sep. 16, 2020.

(51) Int. Cl.
*H01R 12/61* (2011.01)
*G06N 10/40* (2022.01)
(Continued)

(52) U.S. Cl.
CPC ............ *H01R 12/61* (2013.01); *H01R 43/02* (2013.01); *H05K 1/0281* (2013.01); *H05K 1/023* (2013.01); *H05K 1/09* (2013.01)

(58) Field of Classification Search
CPC .......... H05K 1/14; H05K 1/142; H05K 1/147; H05K 1/0393; H05K 1/0225; H05K 1/09;
(Continued)

(56) References Cited

U.S. PATENT DOCUMENTS

2005/0136703 A1  6/2005  Van Schuylenbergh et al.
2019/0027800 A1  1/2019  El Bouayadi et al.

FOREIGN PATENT DOCUMENTS

JP  H05299708 A  11/1993
JP  H05304224 A  11/1993
(Continued)

OTHER PUBLICATIONS

International Preliminary Report on Patentability for Application No. PCT/US2021/050637, dated Mar. 30, 2023, 8 pages.
(Continued)

*Primary Examiner* — Hoa C Nguyen
*Assistant Examiner* — Amol H Patel
(74) *Attorney, Agent, or Firm* — Dority & Manning, P.A.

(57) ABSTRACT

Interconnections for connecting flex circuit boards in classical and/or quantum computing systems can include a first flex circuit board having a removed portion that exposes one or more signal lines and a second flex circuit board having a removed portion that exposes one or more other signal lines. The flex circuit boards can be aligned at the removed portions to form a signal trace gap near the exposed signal lines. Exposed signal lines of the first flex circuit board can be coupled with exposed signal lines of the second flex circuit board. A ground support layer can be coupled to the first flex circuit board and the second flex circuit board along the same side. An isolation plate at least partially covering the signal trace gap can be coupled to the first flex circuit board and/or the second flex circuit board on a side opposite of the ground support layer.

23 Claims, 5 Drawing Sheets

(51) Int. Cl.
  *G06N 10/80* (2022.01)
  *H01R 43/02* (2006.01)
  *H05K 1/02* (2006.01)
  *H05K 1/03* (2006.01)
  *H05K 1/09* (2006.01)
  *H05K 1/14* (2006.01)
  *H05K 3/36* (2006.01)
  *H10N 60/80* (2023.01)

(58) Field of Classification Search
  CPC ...... H05K 1/023; H05K 1/0281; H05K 3/363; H05K 2201/2009; H05K 2201/09327; H05K 2201/09063; H05K 2201/058; H01R 12/61; H01R 43/02; G06N 10/40; G06N 10/80; H10N 60/80
  See application file for complete search history.

(56) References Cited

FOREIGN PATENT DOCUMENTS

JP        H06523621 A      2/1994
WO      WO 2019/050525    3/2019
WO      WO-2019050525 A1 *  3/2019  ............. G06N 10/00

OTHER PUBLICATIONS

International Search Report and Written Opinion for Application No. PCT/US2021/050637, dated Dec. 22, 2021, 5 pages.
Shubin et al., "Novel Packaging with Rematable Spring Interconnect Chips for MCM", 59$^{th}$ Electronic Components and Technology Conference, May 26-29, 2009, San Diego, California, 7 pages.
Chow et al., "Pressure Contact Micro-Springs in Small Pitch Flip-Chip Packages", IEEE Transactions on Components and Packaging Technologies, vol. 29, No. 4, pp. 796-803.
Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.

* cited by examiner

BUTT JOINT FLEX CIRCUIT BOARD INTERCONNECTION

PRIORITY CLAIM

The present application claims the benefit of priority of U.S. Provisional Application Ser. No. 63/079,267, filed on Sep. 16, 2020, titled Butt Joint Flex Circuit Board Mating, which is incorporated herein by reference.

FIELD

The present disclosure relates generally to interconnections that can be used, for instance, for classical and quantum computing systems.

BACKGROUND

Quantum computing is a computing method that takes advantage of quantum effects, such as superposition of basis states and entanglement, to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as $a|0\rangle + b|1\rangle$. The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example embodiment of the present disclosure is directed to an interconnection for connecting a plurality of flex circuit boards. The interconnection includes a first flex circuit board comprising a first ground plane, a first dielectric layer, a first set of one or more signal lines, a second dielectric layer, and a second ground plane where the first flex circuit board has a removed portion exposing at least one signal line in the first set of one or more signal lines. The interconnection also includes a second flex circuit board comprising a third ground plane, a third dielectric layer, a second set of one or more signal lines, a fourth dielectric layer, and a fourth ground plane where the second flex circuit board has a removed portion exposing at least one signal line in the second set of one or more signal lines. The removed portion of the first flex circuit board and the removed portion of the second flex circuit board are aligned to form a signal trace gap. A solder bridge is coupled to the at least one signal line in the first set of one or more signal lines and to the at least one signal line in the second set of one or more signal lines at the signal trace gap. An isolation plate at least partially covering the signal trace gap is coupled to at least one of the first ground plane of the first flex circuit board and the third ground plane of the second flex circuit board.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
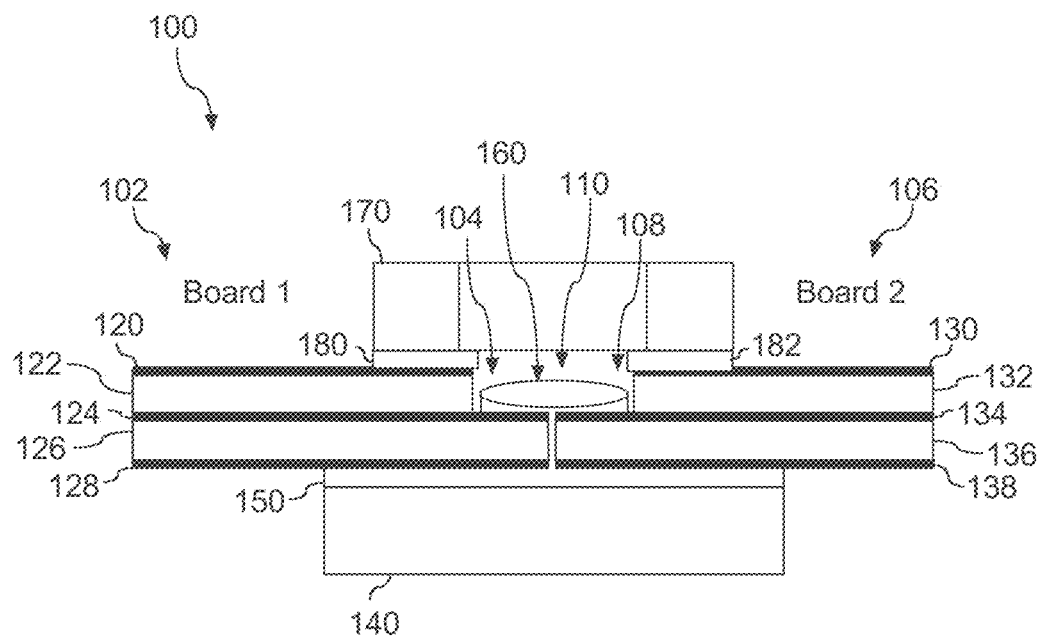
FIG. 1 depicts a diagram of an example flex circuit board interconnection according to examples of the present disclosure.

Example aspects of the present disclosure are directed to making and using specialized butt joint interconnections that can connect various types of circuit boards including, but not limited to, flexible and semi-flexible circuit boards used in traditional computing systems, quantum computing systems, and other types of electronics (e.g., automobiles, aircraft, satellites, medical devices, smartphones, wearable devices, etc.). A circuit board generally refers to a piece of material with printed or integrated circuits, which is used to connect electronic components and devices. Flex circuit boards can include circuit boards that provide at least some structural flexibility in whole or in part.

Flex circuit boards may be used in a variety of electronics, for example, where flexibility and space savings would be difficult or impossible to achieve with rigid circuit boards. While flex circuit boards can have advantages over rigid circuit boards, connecting flex circuit boards can be problematic. For example, the inherent pliability of flex circuit boards presents an increased risk of damage during handling and use due to movement and reduced structural support. In addition, the repair or replacement of damaged flex circuit boards can be inconvenient and expensive. As such, the present disclosure describes new and improved ways of making and using butt joints that interconnect flexible circuit boards.

According to example aspects of the present disclosure, a butt joint interconnection for interconnecting multiple circuit boards, such as flex circuit boards, may include a first flex circuit board with a removed portion exposing one or more signal lines and a second flex circuit board also with a removed portion exposing one or more signal lines. The flex circuit boards may be aligned at the edges of the removed portions with the exposed signal lines, forming a signal trace gap between the flex circuit boards. A ground support layer may extend at least partially across one side of the aligned flex circuit boards. A solder bridge can be used to connect the exposed signal lines of the aligned flex circuit boards. In addition, an isolation plate may cover the trace signal gap formed by the removed portions of the aligned flex circuit board on the side opposite of the ground support layer above the solder bridge. In some examples, one or more of the ground planes may comprise superconductive material that, for example, exhibit superconductivity at a temperature less than about 3 Kelvin, such as less than about 1 Kelvin, such as less than about 20 milliKelvin.

Example aspects of the present disclosure also are directed to methods of producing wiring structures for interconnecting various types of circuit boards in, for example, computing systems, quantum computing systems, and different types of electronics (e.g., automobiles, aircraft, satellites, medical devices, smartphones, wearable devices, etc.). A method may include, for example, obtaining a first circuit board and removing a portion of the first circuit board exposing at least one signal line of the first circuit board, obtaining a second circuit board and removing a portion of the second circuit board exposing at least one signal line of the second circuit board, aligning the side of the removed portion of first circuit board and the side of the removed portion of the second circuit board to form a signal trace gap between the flex circuit boards near the exposed signal lines of the respective boards, coupling a ground support layer at least partially across one side of each of the aligned circuit boards, connecting the exposed signal lines of the aligned circuit boards using a solder bridge or another type of connective material, and coupling an isolation plate to the circuit boards on the side opposite of the ground support layer covering the trace signal gap and the connected signal lines. Further, one or more of the ground planes may comprise superconductive material that, for example, exhibits superconductivity at a temperature less than about 3 Kelvin, such as less than about 1 Kelvin, such as less than about 20 milliKelvin. Such superconductive ground planes may be used, for example, in superconductive quantum computing systems that perform substantially faster than any classical computing system.

Aspects of the present disclosure provide a number of technical effects and benefits. For instance, the various examples of the interconnections described in the present disclosure provide increased reinforcement and durability when interconnecting flex circuit boards, which may flex, bend, or contort to fit a final assembly. For example, the flex circuit board interconnections described herein protect against and reduce the likelihood of damage during installation, deployment, use, and maintenance of various types of traditional computing systems, quantum computing systems, consumer devices, industrial equipment, aerospace equipment, etc. As such, these new and improved flex circuit board interconnections provide greater dependability and resiliency when compared to traditional interconnections, thereby reducing damage, repair, replacement, downtime, and costs associated with various types of systems, devices, and equipment dependent on flex circuit boards.

As used herein, a "flex circuit board" refers to a board including at least one generally planar substrate (e.g., layered substrates) or other support on which the one or more signal lines are formed or otherwise disposed and having flexibility in at least one plane. Flexibility refers to the ability to be deformed without breaking. For example, a rectangular flex circuit board may be flexible along the largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

As used herein, the use of the term "about" or "approximately" in conjunction with a stated numerical value is intended to refer to within 10% of the stated numerical value.

With reference now to the Figures, example embodiments of the present disclosure will be discussed in further detail. Aspects of the present disclosure are discussed with referenced to interconnections for flex circuit boards in quantum computing systems for purposes of illustration and discussion. Those of ordinary skill in the art, using the disclosures provided herein, will understand that the interconnection can be used in other applications without deviating from the scope of the present disclosure.

FIG. 1 depicts a diagram of an example flex circuit butt joint according to example embodiments of the present disclosure. In an example, flex circuit butt joint 100 includes a first flex circuit board 102, a second flex circuit board 106, a ground support layer 140, a solder connection 150, a solder bridge 160, an isolation plate 170, solder connection 180, and solder connection 182.

First flex circuit board 102 includes a removed portion 104, ground plane 120, dielectric layer 122, signal line(s) 124, dielectric layer 126, and ground plane 128. In an example, removed portion 104 of first flex circuit board 102 exposes some or all of signal line(s) 124. In some examples, removed portion 104 is a pocket etched or otherwise created on an edge or a side of first flex circuit board 102, which exposes signal line(s) 124 to be butt-connected with signal lines of another board (e.g., exposed signal line(s) 134 of second flex circuit board 106).

Second flex circuit board 106 includes a removed portion 108, ground plane 130, dielectric layer 132, signal line(s) 134, dielectric layer 136, and ground plane 138. In an example, removed portion 108 of first flex circuit board 102 exposes some or all of signal line(s) 134. In some examples, removed portion 108 is a pocket etched or otherwise created on an edge or a side of second flex circuit board 106, which exposes signal line(s) 134 to be butt-connected, for example, with signal line(s) 124 of first flex circuit board 102 or another board.

In an example, first flex circuit board 102 and second flex circuit board 106 are aligned such that removed portion 104 of first flex circuit board 102 and removed portion 108 of second flex circuit board 106 are positioned towards or facing one another. For example, first flex circuit board 102 and second flex circuit board 106 may be substantially aligned in a manner where removed portion 104 and removed portion 108 form a signal trace gap 110.

In an example, signal trace gap 110 generally describes an area of physical space where signal line(s) 124 are exposed in relation to removed portion 104 of first flex circuit board 102 and signal line(s) 134 are exposed in relation to removed portion 108 of second flex circuit board 106. As such, signal trace gap 110 generally may be an area formed when removed portion 104 of first flex circuit board 102 and removed portion 108 of second flex circuit board 106 are positioned in relative proximity to one another.

In an example, a side or an edge of first flex circuit board 102 corresponding to removed portion 104 is aligned in proximity with a side or an edge of second flex circuit board 106 corresponding to removed portion 108. In some examples, removed portion 104 of first flex circuit board 102 and removed portion 108 of second flex circuit board 106 may be positioned such that first flex circuit board 102 and second flex circuit board 106 touch or are in contact with one another near signal trace gap 110. In some examples, first flex circuit board 102 and second flex circuit board 106 may not touch, but instead may remain in relative or close proximity to one another. In some examples, one or more exposed signal line(s) 124 touch or are in contact with one or more exposed signal line(s) 134 near signal trace gap 110, for example, when first flex circuit board 102 and second flex circuit board 106 touch or are in contact.

In an example, solder bridge 160 connects one or more exposed signal line(s) 124 with one or more exposed signal line(s) 134 near signal trace gap 110. For example, solder bridge 160 may connect exposed signal line(s) 124 either that are in contact or not in contact with exposed signal line(s) 134, and either when first flex circuit board 102 and second flex circuit board 106 touch or do not touch. Solder bridge 160 generally may be any type of connective substance or layer, for example, such as a solder bridge or connective material that joins different objects or elements together.

In an example, solder bridge 160 comprises one or more conductive materials that allow current, pulses, signals, and/or other types of communication to pass or travel across or through signal line(s) 124 and signal line(s) 134, or vice versa. In some examples, solder bridge 160 may be comprised of one or more conductive metals including, but not limited to, silver, copper, gold, aluminum, etc. In some examples, solder bridge 160 may be comprised of one or more superconductive materials that become superconducting under certain conditions, for example, such as at a temperature less than about 3 Kelvin, such as less than about 1 Kelvin, such as less than about 20 milliKelvin. In some examples, solder bridge 160 may comprise one or more conductive adhesives, for example, in addition to or instead of solder material. Conductive adhesives generally may include electrically conductive adhesives, pastes, or glues. Such conductive adhesives may comprise one or more conductive materials and/or one or more materials that become superconducting under certain conditions.

Ground support layer 140 is coupled to ground plane 128 of first flex circuit board 102 and to ground plane 138 of second flex circuit board 106 via solder connection 150. In an example, ground support layer 140 extends at least partially across first flex circuit board 102 and also at least partially across second flex circuit board 106. Ground support layer 140 may be coupled to an external portion of first flex circuit board 102 and to an external portion of second flex circuit board 106, for example, to join and provide support for adjoined flex circuit boards. In an example, solder connection 150 may be one or more solder or adhesive connections coupling ground support layer 140 to first flex circuit board 102 and to second flex circuit board 106.

Isolation plate 170 is coupled to ground plane 120 of first flex circuit board 102 via solder connection 180 and to ground plane 130 of second flex circuit board 106 via solder connection 182. In an example, isolation plate 170 extends at least partially across first flex circuit board 102 and at least partially across second flex circuit board 106, covering signal trace gap 110 on a side opposite of ground support layer 140. In some examples, isolation plate 170 covers signal trace gap 110, signal line(s) 124 near removed portion 104 of first flex circuit board 102, solder bridge 160 (when present), and signal line(s) 134 near removed portion 108 of second flex circuit board 106. In some examples, isolation plate 170 may be coupled to one or both of first flex circuit board 102 and/or second flex circuit board 106. Also, flex circuit butt joint 100 may include isolation plate 170 with or without use of ground support layer 140.

In an example, flex circuit butt joint 100 may be configured, for example, without ground support layer 140 and without isolation plate 170, with at least one of ground support layer 140 or isolation plate 170, or with both ground support layer 140 and isolation plate 170. In some examples, one or more of ground support layer 140 and/or isolation plate 170 may be comprised of copper. In some examples, isolation plate 170 may have one or more holes that are cut out before, during, and/or after circuit board coupling, for example, to provide access to signal line(s) 124, 134 near signal trace gap 110.

In some examples, flex circuit butt joint 100 is used to join two separate flex circuit boards together. In some examples, flex circuit butt joint 100 may join one flex circuit board with another type of circuit board, such as a rigid circuit board. In addition, examples of the present disclosure may be used to join any two separate flexible or rigid circuit boards together. Various examples of flex circuit butt joint 100 may be used to connect different flex and other types of circuit boards used in quantum computing systems, classical computing systems, and/or in conjunction with both quantum and classical computing systems, such as interconnects used to join quantum and classical computing systems for operation together. In various examples, any number of flex circuit boards and/or other types of boards each may be joined or chained together, for example, consecutively one after another using multiple different flex circuit butt joint 100 interconnections. For example, second flex circuit board 106 could be joined with a third circuit board (not shown) via a flex circuit butt joint, which could be joined with a fourth circuit board (also not shown) via another flex circuit butt joint, etc.

Figure 2:
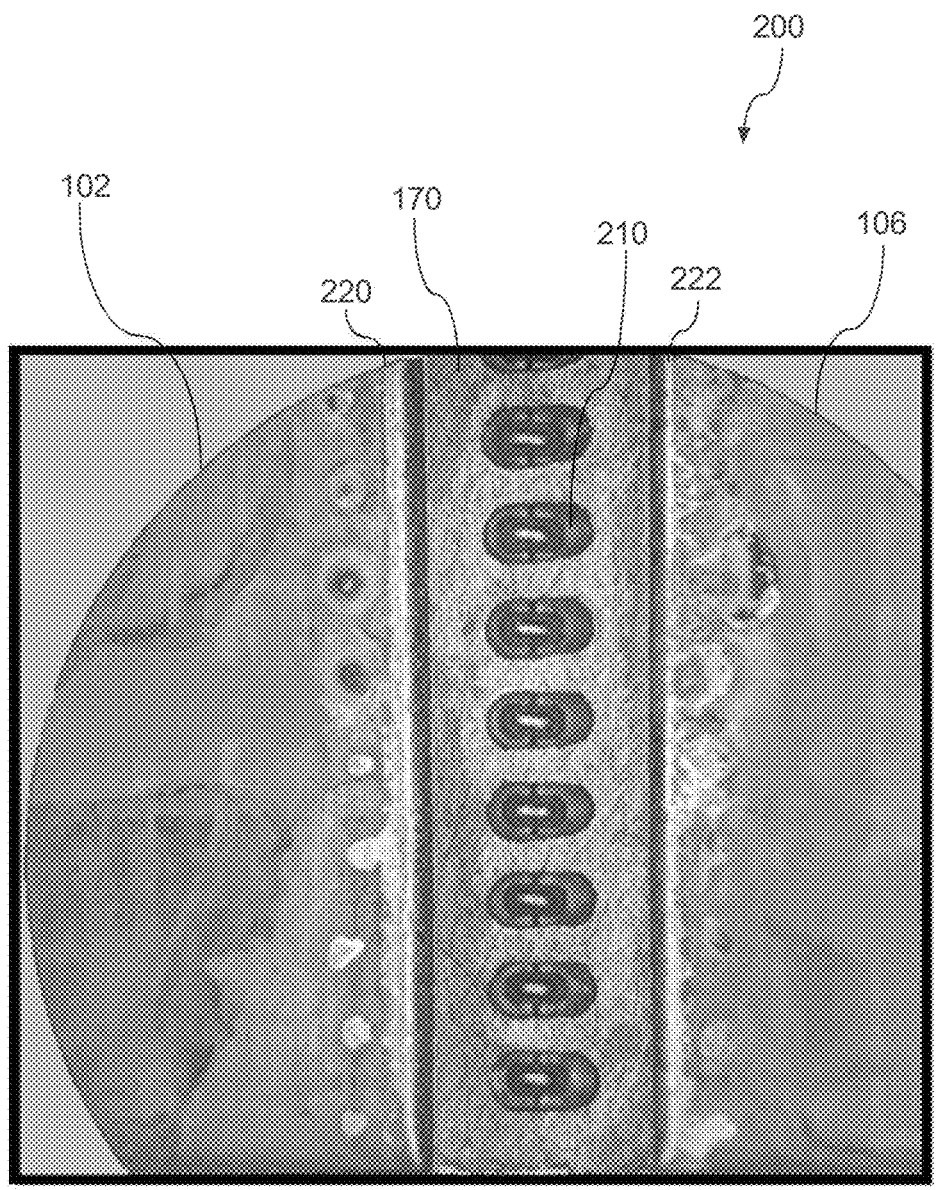
FIG. 2 depicts an illustration showing a top view scan of an example flex circuit board interconnection according to examples of the present disclosure.

FIG. 2 depicts an illustration showing a top view scan of an example flex circuit butt joint according to examples of the present disclosure.

As an example, top view illustration 200 of example flex circuit butt joint includes first flex circuit board 102, second flex circuit board 106, isolation plate 170, and an oval cavity 210 showing an island of solder (e.g., solder bridge 160) connecting signal traces (e.g., signal line(s) 124 of first flex circuit board 102 and signal lines(s) 134 of second flex circuit board 106). Isolation plate 170 is coupled to first flex circuit board 102 via solder connection 220 and also to second flex circuit board 106 via a solder connection 222.

Figure 3:
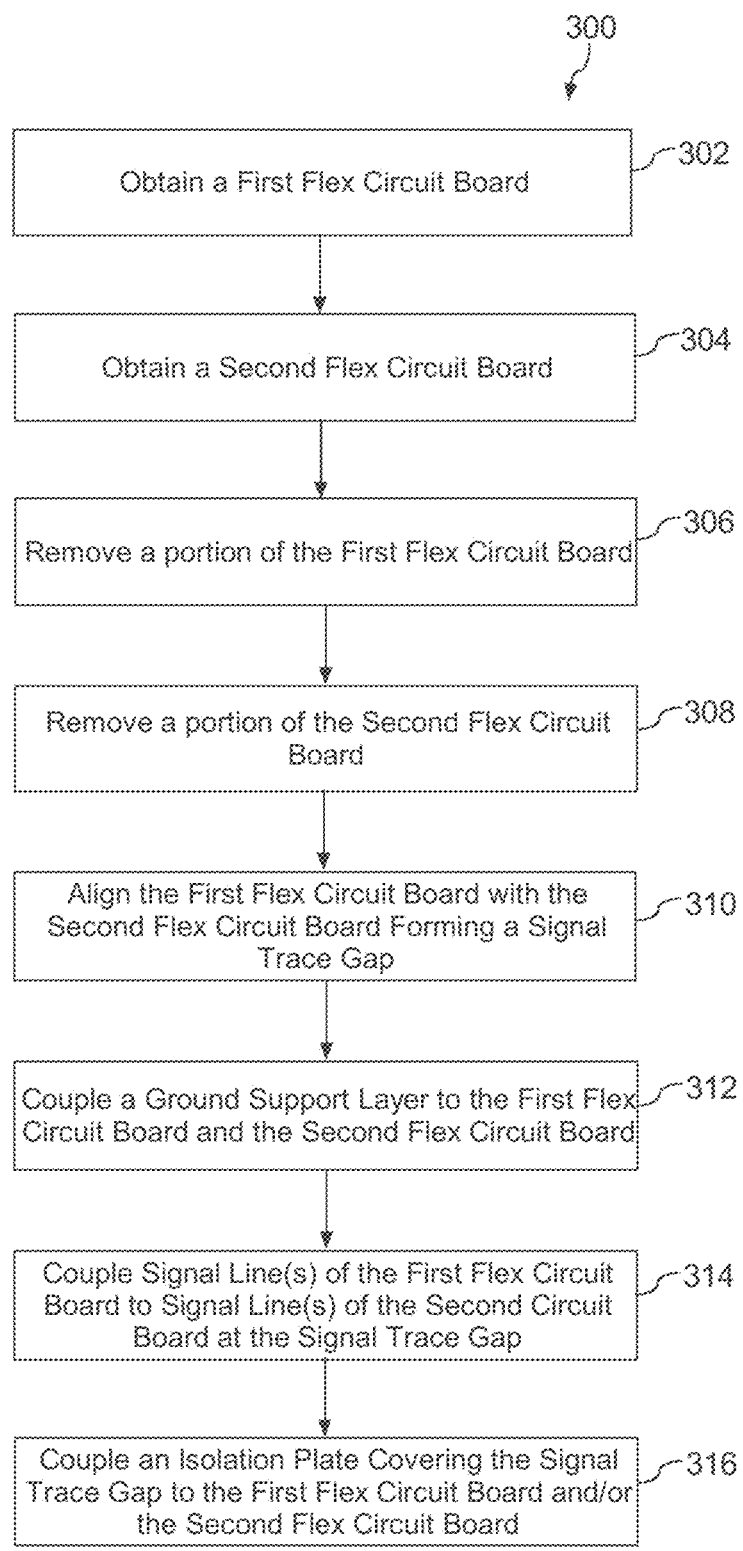
FIG. 3 depicts a flow diagram of an example method for producing an interconnection according to examples of the present disclosure.

FIG. 3 depicts a flow diagram of an example method for producing a wiring structure for a quantum computing system according to examples of the present disclosure. Although FIG. 3 depicts steps performed in a particular order for purposes of illustration and discussion as an example, the methods of the present disclosure are not limited to the particularly illustrated order or arrangement. As such, the various steps of the method 300 can be omitted, rearranged, combined, and/or adapted in various ways without deviating from the scope of the present disclosure.

At 302, a first flex circuit board 102 is obtained. For example, first flex circuit board 102 respectively may comprise a first ground plane 120, a first dielectric layer 122, one or more signal lines 124, a second dielectric layer 126, and a second ground plane 128. In some examples, one or more of ground plane 120 and/or ground plane 128 may be comprised with a conductive material. For example, one or more of ground plane 120 and/or ground plane 128 may comprise a superconductive material that is superconducting under certain conditions, such as at a temperature less than about 3 Kelvin, such as less than about 1 Kelvin, such as less than about 20 milliKelvin.

In an example, first flex circuit board 102 is obtained in an original or unmodified state, without removed portion 104 and without exposed signal line(s) 124. First flex circuit board 102 also may be obtained with some type of removed portion 104, which may or may not expose signal line(s) 124. In some examples, first flex circuit board 102 may also be cleaned to improve solder adhesion.

At 304, a second flex circuit board 106 is obtained. For example, the second flex circuit board 106 respectively may comprise a first ground plane 130, a first dielectric layer 132, one or more signal lines 134, a second dielectric layer 136, and a second ground plane 138. In some examples, one or more of ground plane 130 and/or ground plane 138 may be comprised with a conductive material. For example, one or more of ground plane 130 and/or ground plane 138 may comprise a superconductive material that is superconducting under certain conditions, such as at a temperature less than about 3 Kelvin, such as less than about 1 Kelvin, such as less than about 20 milliKelvin.

In an example, second flex circuit board 106 is obtained in an original or unmodified state, without removed portion 108 and without exposed signal line(s) 134. Second flex circuit board 106 also may be obtained with some type of removed portion 108, which may or may not expose signal line(s) 134. In some examples, second flex circuit board 106 may also be cleaned to improve solder adhesion.

At 306, a portion of the first flex circuit board 102 is removed to expose one or more signal lines 124 at a removed portion 104 of first flex circuit board 102. In an example, a portion of first flex circuit board 102 is removed, creating removed portion 104 and exposing one or more signal line(s) 124. In some examples, a portion of first flex circuit board 102 may be removed to enlarge or modify an existing removed portion (e.g., a partially removed portion), for example, to adjust a size of removed portion 104 and/or to expose or further expose signal line(s) 124. In an example, ablation or any other type of vaporization, erosion, or physical removal process(es) may be used to create or modify removed portion 104 of first flex circuit board 102.

At 308, a portion of the second flex circuit board 106 is removed to expose one or more signal lines 134 at the removed portion 108 of the second flex circuit board 106. In an example, a portion of second flex circuit board 106 is removed, creating removed portion 108 and exposing one or more signal line(s) 134. In some examples, a portion of second flex circuit board 106 may be removed to enlarge or modify an existing removed portion (e.g., partially removed portion), for example, to adjust a size of removed portion 108 and/or to expose or further expose signal line(s) 134. In an example, ablation or any other type of vaporization, erosion, or physical removal process(es) may be used to create or modify removed portion 108 of second flex circuit board 106.

In an example, ablation may be performed to create or modify removed portion 104 of first flex circuit board 102 and/or removed portion 108 of second flex circuit board 106. For example, ablation may be performed to remove material from first flex circuit board 102, to create or enlarge removed portion 104, and/or to expose signal line(s) 124. Similarly, ablation may be performed to remove material from second flex circuit board 106, to create or enlarge removed portion 108, and/or to expose signal line(s) 134. Generally, ablation may be performed through the use of lasers, chemicals, heat, physical removal (e.g., chipping, cutting, etc.), and/or any other type of removal process(es). Also, generally, material may be removed using one or more other type(s) of removal processes.

In some examples, ablation (e.g., via a laser) is used to cut a cavity in a top ground plane layer (e.g., ground plane 120) and a top dielectric layer (e.g., dielectric layer 122) of first flex circuit board to expose signal line(s) 124, and/or a top ground plane layer (e.g., ground plane 130) and a top dielectric layer (e.g., dielectric layer 132) of second flex circuit board 106 to expose signal line(s) 134. In some examples, one or more dielectric layers may be comprised of Kapton or other material(s). In some examples, one or more of 306 and/or 308 may not be performed, for example, when a respective flex circuit board already comprises a removed portion that exposes one or more signal lines.

At 310, the removed portion 104 of the first flex circuit board 102 and the removed portion 108 of the second flex circuit board 106 are aligned to form a signal trace gap 110. In an example, a side or edge of first flex circuit board 102 corresponding to removed portion 104 is aligned with a side or edge of second flex circuit board 106 corresponding to removed portion 108 so that removed portion 104 and removed portion 108 face one another, for example, from opposite sides in a symmetrical or substantially symmetrical manner. In some examples, heated assembly jigs may be used, for example to align first flex circuit board 102 with second flex circuit board 106 and to perform various steps of assembling flex circuit butt joint 100.

In some examples, first flex circuit board 102 and second flex circuit board 106 are laterally aligned and meet or butt up against one another near removed portion 104 of first flex circuit board 102 and removed portion 108 of the second flex circuit board 106 based on the alignment that forms signal trace gap 110. In some examples, exposed signal line(s) 124 of first flex circuit board 102 near removed portion 104 touch or are in contact with exposed signal line(s) 134 of second flex circuit board 106 near removed portion 108. In some examples, an amount of space may exist between first flex circuit board 102 and second flex circuit board 106 and/or exposed signal line(s) 124 near removed portion 104 and exposed signal line(s) 134 near removed portion 108.

At 312, a ground support layer 140 that extends at least partially across the first flex circuit board 102 and at least partially across the second flex circuit board 106 is coupled to one side of first flex circuit board 102 and also to one side of second flex circuit board 106. In an example, ground support layer 140 extends across one side of first flex circuit board 102 and is coupled to an outer layer of first flex circuit board 102, such as ground plane 128. Continuing with the example, ground support layer 140 further extends across one side of second flex circuit board 106 and is coupled to an outer layer of second flex circuit board 106, such as ground plane 138. For example, ground support layer 140 may be coupled to each of first flex circuit board 102 and second flex circuit board 106 when the flex circuit boards are aligned and form signal trace gap 110. In an example, ground support layer 140 is coupled to each of first flex circuit board 102 and second flex circuit board 106 as both flex circuit boards are held steady in a fixed or stable alignment, for example, via a heated or unheated assembly jig or other similar device(s).

In an example, ground support layer 140 is coupled to each of first flex circuit board 102 and second flex circuit board 106 via solder connection 150 on a side opposite of signal trace gap 110. For example, ground support layer 140 generally may be positioned to provide one or more of a ground connection and/or mechanical support for first flex circuit board 102 and second flex circuit board 106. In an example, solder connection 150 may be one or more portions of solder and/or adhesive material that join ground support layer 140 to first flex circuit board 102 and to second flex circuit board 106. In some examples, flex circuit butt joint 100 may include ground support layer 140 and isolation plate 170. In some examples, flex circuit butt joint 100 may include ground support layer 140 without use of isolation plate 170.

At 314, at least one signal line in a first set of one or more signal lines 124 and at least one signal line in a second set of one or more signal lines 134 are coupled via a solder bridge 160 at the signal trace gap 110. In an example, signal line(s) 124 may be exposed when removed portion 104 is created by removing a portion of first flex circuit board 102, and/or signal line(s) 134 may be exposed when removed portion 108 is created by removing a portion of second flex circuit board 106. In an example, solder bridge 160 connects exposed signal line(s) 124 with exposed signal line(s) 134 near signal trace gap 110. In an example, solder bridge 160 connects exposed signal line(s) 124 and signal line(s) 134. Solder bridge 160 may also connect exposed signal line(s) 124 that do not touch and are not in contact with exposed signal line(s) 134.

In an example, solder bridge 160 provides connectivity across exposed signal line(s) 124 and exposed signal line(s) 134. For example, solder bridge 160 may be comprised of one or more conductive metals and/or superconductive materials that become superconducting under certain conditions (e.g., at temperatures less than about 1 Kelvin). In some examples, solder bridge 160 generally may comprise one or more conductive and/or superconductive adhesives, for example, in addition to or instead of solder material. Such conductive and/or superconductive adhesives generally may include conductive and/or superconductive adhesives, pastes, glues, etc.

At 316, an isolation plate 170 at least partially covering the signal trace gap 110 is coupled to at least one of the first flex circuit board 102 and the second flex circuit board 106. In an example, isolation plate 170 may extend partially across or completely across signal trace gap 110. For example, isolation plate 170 generally may provide cover and protection for signal line(s) 124, signal line(s) 134, and solder bridge 160 near signal trace gap 110. In an example, isolation plate 170 is coupled to first flex circuit board 102 via solder connection 180 and/or to second flex circuit board 106 via solder connection 182.

In various examples flex circuit butt joint 100 may include isolation plate 170 with or without use of ground support layer 140. In examples where flex circuit butt joint 100 includes both isolation plate 170 and ground support layer 140, isolation plate 170 and ground support layer 140 are positioned on opposite sides. In some examples, thermal reflow is performed on one or more solder connections and/or bridges, for example, after an initial assembly of one or more parts of flex circuit butt joint 100. Further, heated components generally may be cooled prior to testing.

Figure 4:
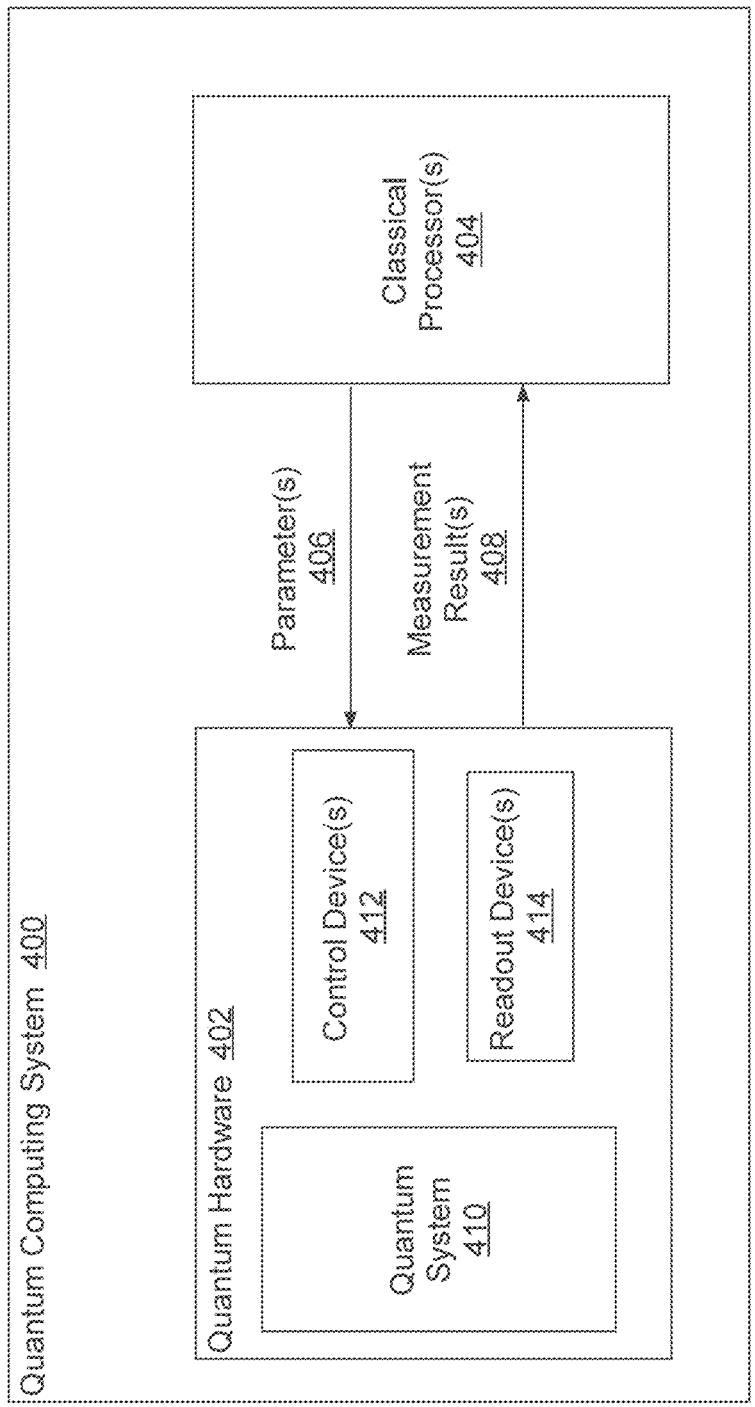
FIG. 4 depicts a block diagram of an example quantum computing system according to examples of the present disclosure.

FIG. 4 depicts a block diagram of an example quantum computing system according to examples of the present disclosure. Quantum computing system 400 is an example of a system implemented as a classical or quantum computer program on one or more classical computers or quantum computing devices in one or more locations, in which the systems, components, and techniques described in the present disclosure can be implemented. Quantum computing system 400 is an example that can be used to implement aspects of the present disclosure. Those of ordinary skill in the art, using the examples provided herein, will understand that other quantum computing structures or systems can be used without deviating from the scope of the present disclosure.

Quantum computing system 400 includes quantum hardware 402 in data communication with one or more classical processor(s) 404. For instance, quantum hardware 402 can represent and/or manipulate information using qubits. A qubit can be or include any suitable quantum device that enables the superposition of multiple states, e.g., data in both the "0" and "1" state. As one example, a qubit can be or include a unit of superconducting material, such as superconducting material that achieves superconductivity in temperatures below about 10 millikelvin (mK).

Quantum hardware 402 can include components for performing quantum computation. For example, quantum hardware 402 can include a quantum system 410, control device(s) 412, and readout device(s) 414 (e.g., readout resonator(s)). Quantum system 410 can include one or more multi-level quantum subsystems, such as a register of qubits. In some implementations, the multi-level quantum subsystems can include superconducting qubits, such as flux qubits, charge qubits, transmon qubits, gmon qubits, etc.

Classical processor(s) 404 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. Classical processor(s) 404 can be configured to, in addition to any other suitable function(s) of classical processor(s) 404, control quantum hardware 402. For instance, classical processor(s) 404 can be coupled to quantum hardware 402 (e.g., by signal lines) and/or configured to send control signals to perform quantum operations using quantum hardware 402. As one example, classical processor(s) 404 can be configured to send control signals that implement quantum gate operations at quantum hardware 402 (e.g., by control device(s) 412). Additionally and/or alternatively, classical processor(s) 404 can be configured to send control signals that cause quantum hardware 402 to perform quantum state measurements and/or provide the quantum state measurements to classical processor(s) 404 (e.g., by readout device(s) 414 such as readout resonator(s)). For example, classical processor(s) 404 can receive measurements of the quantum system 410 that can be interpretable by classical processor(s) 404.

The type of multi-level quantum subsystems that quantum computing system 400 utilizes may vary. For example, in some cases it may be convenient to include one or more readout device(s) 414 (e.g., readout resonator(s)) attached to one or more superconducting qubits, e.g., transmon, flux, gmon, xmon, or other qubits.

Quantum circuits may be constructed and applied to the register of qubits included in the quantum system 410 via multiple signal lines (e.g., signal line(s) 124, 134 of FIG. 1) that are coupled to one or more control devices 412. Example control devices 412 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. One or more control devices 412 may be configured to operate on quantum system 410 through one or more respective control parameters (e.g., one or more physical control parameters 406). For example, in some implementations, the multi-level quantum subsystems may be superconducting qubits and control devices 412 may be configured to provide control pulses to control lines (e.g., signal line(s) 124, 134 of FIG. 1) to generate magnetic fields to adjust a frequency of the qubits.

Quantum hardware 402 may further include readout devices 414 (e.g., readout resonators). Measurement results 408 obtained via measurement devices may be provided to classical processors 404 for processing and analyzing. In some examples, quantum hardware 402 may include a quantum circuit and control device(s) 412, and readout devices may implement one or more quantum logic gates that operate on quantum system 410 through physical control parameters (e.g., microwave pulse) that are sent through wires included in quantum hardware 402. Further examples of control devices include arbitrary waveform generators, wherein a DAC creates the signal.

Readout device(s) 414 (e.g., readout resonator(s)) may be configured to perform quantum measurements on quantum system 410 and send (e.g., by signal line(s) 124, 134 of FIG. 1) measurement results 408 to classical processor(s) 404. In addition, quantum hardware 402 may be configured to receive data (e.g., by signal line(s) 124, 134 of FIG. 1) specifying values of physical control parameter(s) 406 from classical processor(s) 404. Quantum hardware 402 may use the received values of physical control parameter(s) 406 to update the action of control device(s) 412 and readout devices(s) 414 (e.g., readout resonator(s)) on quantum system 410. For example, quantum hardware 402 may receive data specifying new values representing voltage strengths of one or more DACs included in control device(s) 412 and may update the action of the DACs on quantum system 410 accordingly. Classical processor(s) 404 may be configured to initialize quantum system 410 in an initial quantum state, for example, by sending data to quantum hardware 402 specifying an initial set of parameters 406.

Readout device(s) 414 (e.g., readout resonator(s)) can take advantage of a difference in the impedance for the |0⟩ and |1⟩ states of an element of quantum system 410, such as a qubit, to measure the state of the element (e.g., the qubit). For example, the resonance frequency of a readout resonator can take on different values when a qubit is in the state |0⟩ or the state |1⟩, due to the nonlinearity of the qubit. Therefore, a microwave pulse reflected from a readout device 414 (e.g., readout resonator) carries an amplitude and phase shift that depends on the qubit state. In some examples, a Purcell filter can be used in conjunction with readout device(s) 414 (e.g., readout resonator(s)) to impede microwave propagation at the qubit frequency.

Quantum computing system 400 includes control device(s) 412. Control device(s) 412 can operate the quantum hardware 402. For example, control device(s) 412 can include a waveform generator configured to generate control pulses according to example aspects of the present disclosure.

In some examples, control device(s) 412 may include a data processing apparatus and associated memory. The memory may include a computer program having instructions that, when executed by a data processing apparatus, cause the data processing apparatus to perform one or more operations, such as applying a control signal to a qubit and/or to a tunable coupler.

Quantum hardware 402, such as, but not limited to, quantum system 410, control device(s) 412, readout device(s) 414, and/or any other suitable components of quantum hardware 402, can be located within a cryogenic cooling system (not shown). Additionally and/or alternatively, classical processor(s) 404 can be located outside a cryogenic cooling system. For instance, a cryogenic cooling system can be configured to cool quantum hardware 402. Additionally and/or alternatively, classical processor(s) 404 are not cooled by a cryogenic cooling system. For instance, classical processor(s) 404 can operate at temperatures around room temperature (e.g., around 300 Kelvin) and/or temperatures around about 100 Kelvin, whereas quantum hardware 402 can operate at temperatures around about absolute zero (e.g., less than about 20 milliKelvin), which may require cooling by a cryogenic cooling system to operate effectively.

Quantum computing system 400 can include signal lines (not shown). The signal lines can couple classical processor(s) 404 to quantum hardware 402. For instance, as classical processor(s) 404 and quantum hardware 402 can be in signal communication, such as to transmit parameter(s) 406 and/or measurement result(s) 408 and/or any other suitable signals, classical processor(s) 404 can be coupled to quantum hardware 402 by signal lines. For instance, signal lines can be or can include any suitable physical communicative coupling(s) (e.g., one or more wires) configured to couple quantum hardware 402 and classical processor(s) 404. Generally, signal lines may include physical connections to allow for faster and/or more robust communication between quantum hardware 402 and classical processor(s) 404. Further, signal lines can be at least partially located in a cryogenic cooling system, for example, to provide coupling to quantum hardware 402.

Figure 5:
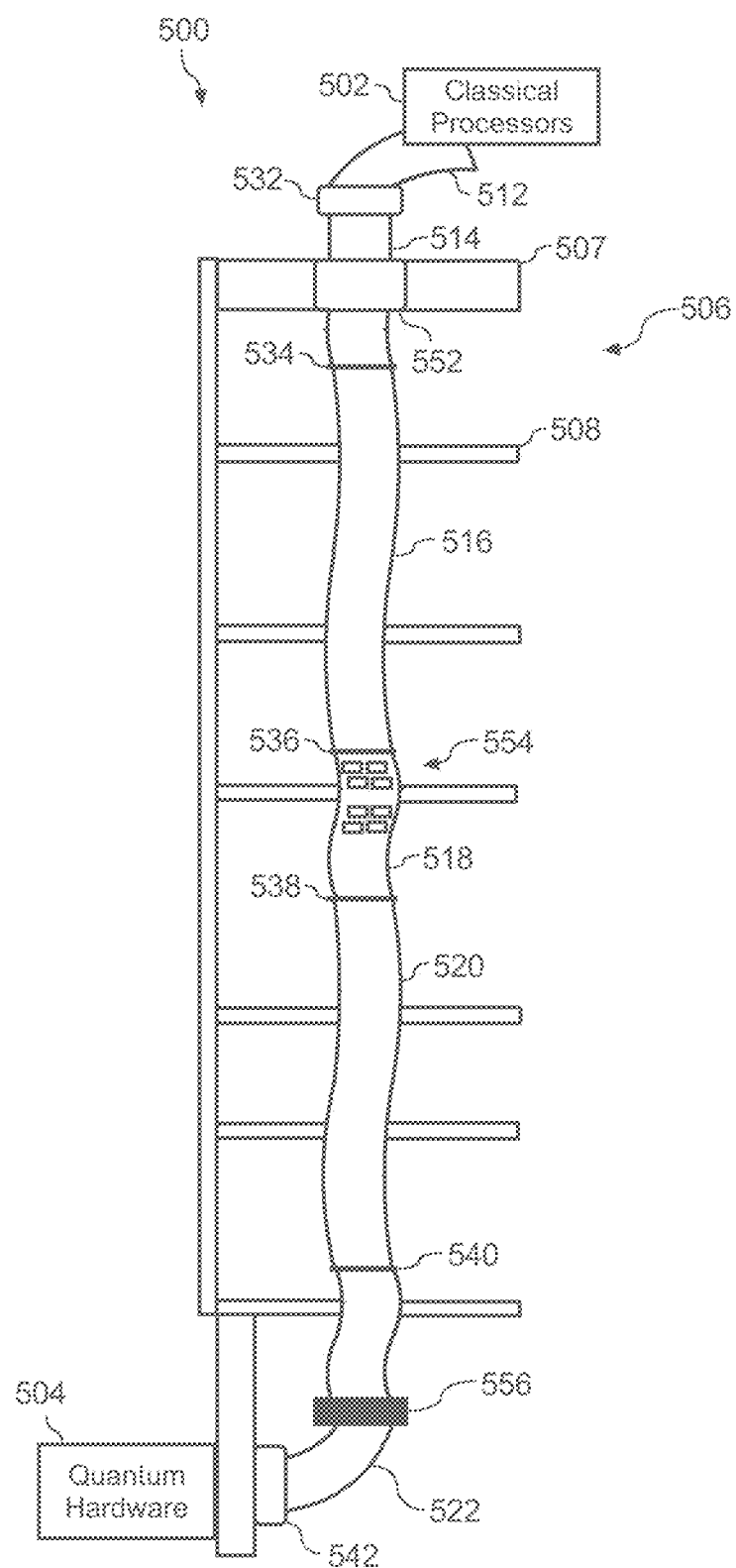
FIG. 5 depicts an example quantum computing system according to examples of the present disclosure.

FIG. 5 depicts an example quantum computing system according to examples of the present disclosure. Quantum computing system 500 can include one or more classical processors 502 and quantum hardware 504 including one or more qubits. Quantum computing system 500 can include a chamber mount 508 configured to support the quantum hardware 504 and a vacuum chamber configured to receive the chamber mount 508 and dispose the quantum hardware 504 in a vacuum. The vacuum chamber can form a cooling gradient from an end of the vacuum chamber (e.g., cap 507) to the quantum hardware 504. For example, the vacuum chamber can form a cooling gradient from a first temperature, such as room temperature (e.g., about 300 Kelvin) to a second temperature, such as at or about absolute zero (e.g., about 10 millikelvin), such as to provide a temperature at the quantum hardware 504 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

Quantum computing system 500 can include one or more signal lines between classical processor(s) 502 and quantum hardware 504. According to example aspects of the present disclosure, quantum computing system 500 can include one or more flex circuit boards 506 including one or more signal lines. Flex circuit board(s) 506 can be configured to transmit signals by the one or more signal lines through the vacuum chamber to couple one or more classical processors 502 to quantum hardware 504. Flex circuit board(s) 506 can include a plurality of signal lines and can provide a significantly improved signal line density, in addition to providing improved isolation, reduced thermal conductivity, and/or improved scalability. For instance, including flex circuit boards 506 according to example aspects of the present disclosure to couple classical processors 502 to quantum hardware 504 can provide for infrastructure that reliably scales to the increasingly greater numbers of qubits that are achieved and/or expected in contemporary and/or future quantum computing systems.

In some embodiments, some or all of flex circuit board(s) 506 can include at least one ground layer. The ground layer can form an outer surface of respective flex circuit board(s) 506, such as an outer surface along the largest surface. In some embodiments, respective flex circuit board(s) 506 can include two ground layers, such as two parallel and spaced apart ground layers. For instance, the two ground layers can form both largest outer surfaces of respective flex circuit board(s) 506. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at temperatures below about 1 Kelvin, such as about 0 Kelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, respective flex circuit board(s) 506 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

Respective flex circuit board(s) 506 can include one or more signal lines. The one or more signal lines can be disposed on a surface (e.g., an inner surface) of at least one dielectric layer. As an example, in some embodiments, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at temperatures below about 1 Kelvin, such as about 0 Kelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, thin superconducting material, etc.

In some embodiments, respective flex circuit board(s) 506 can include one or more vias. For instance, the vias can extend through the ground layer(s), the dielectric layer(s), and/or the signal line(s). The vias can serve to improve isolation of the signal lines. Additionally and/or alternatively, the vias can serve to couple multiple ground layers and/or transfer signals between layers of the flex circuit board. In some embodiments, the via(s) can be plated with via plate(s) that extend along the via(s). In some embodiments, the via plate(s) can be or can include conductive material, such as copper.

For instance, in some embodiments, a quantum computing system 500 can include quantum hardware 504 in data communication with one or more classical processor(s) 502. For instance, quantum hardware 504 can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity in at least temperatures below about 100 millikelvin, which can require operating at a reduced temperature, such as below about 100 millikelvin. In some embodiments, the quantum computing system 500 can include one or more multi-level quantum subsystems, such as a register of qubits. In some embodiments, the multi-level quantum subsystems can include superconducting qubits, such as flux qubits, charge qubits, transmon qubits, gmon qubits, etc.

Classical processor(s) 502 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. Classical processor(s) 502 can be configured to, in addition to any other suitable function(s) of classical processor(s) 502, control the quantum hardware 504. For instance, classical processor(s) 502 can be coupled to quantum hardware 504 (e.g., by signal lines included in flex circuit boards 506 according to example aspects of the present disclosure) and/or configured to send control signals to perform quantum operations using quantum hardware 504. As one example, classical processor(s) 502 can be configured to send control signals that implement quantum gate operations at quantum hardware 504 (e.g., by control device(s)). Additionally and/or alternatively, classical processor(s) 502 can be configured to send control signals that cause quantum hardware 504 to perform quantum state measurements and/or provide the quantum state measurements to classical processor(s) 502 (e.g., by readout device(s)). For example, classical processor(s) 502 can receive measurements of the quantum system that can be interpretable by classical processor(s) 502.

According to example aspects of the present disclosure, quantum computing system 500 can include one or more flex circuit boards 506 including one or more signal lines. Classical processor(s) 502 can be coupled to at least one first flex circuit board. For instance, classical processor(s) 502 can be coupled to the first flex circuit board(s) 514 by a classical-flex interconnect 532. Classical-flex interconnect 532 can convert from a classical signal transmission medium 512 (e.g., a coaxial cable) to first flex circuit board(s) 514.

As one example, classical-flex interconnect 532 can be or can include a compression interposer. The compression interposer can include an array (e.g., a two-dimensional array) of spring pads. A connector receiving signals from classical processor(s) 502, such as via one or more coaxial cables 512 (e.g., one coaxial cable 512 per signal line) can be compressed against the compression interposer to form signal communications between the spring pads and the connector (e.g., the coaxial cables). The spring pads can each be coupled to a signal line on the first flex circuit board 514 such that signals can be transmitted from classical processor(s) 502 (e.g., the coaxial cables) to the signal lines. The compression interposer can provide for connecting signal transmission media 512 having a relatively lower spatial density, such as coaxial cables, which may occupy a relatively larger amount of space per cable, to signal transmission media having a relatively higher spatial density, such as signal lines embedded in a first flex circuit board 514 provided according to example aspects of the present disclosure. Additionally, the compression interposer can achieve high isolation between signal lines and/or low reflectivity along a signal line that is/are suitable for quantum computing applications.

In some embodiments, first flex circuit board(s) 514 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, first flex circuit board(s) 514 can include copper signal lines and/or ground layer(s) to provide high signal transfer performance characteristics.

First flex circuit board(s) 514 can pass through a hermetic seal 552 positioned at an end (e.g., an entrance) of the vacuum chamber, such as cap 507. For example, a flex circuit board (e.g., first flex circuit board 514) can be configured to pass through the hermetic seal 552 such that a first portion of the flex circuit board (e.g., first flex circuit board 514) is disposed in the vacuum chamber and a second portion of the flex circuit board (e.g., first flex circuit board 514) is disposed outside of the vacuum chamber while the hermetic seal 552 forms a vacuum seal for the vacuum chamber. Hermetic seal 552 can provide for first flex circuit board(s) 514 to enter the vacuum chamber without (e.g., substantially) destroying a vacuum created by the vacuum chamber. As one example, hermetic seal 552 can include a fitted seal for each first flex circuit board 514. The fitted seal(s) can receive first flex circuit board(s) 514 and form a vacuum seal with surface(s) of first flex circuit board(s) 514. Additionally, hermetic seal 552 can include one or more seal slots configured to receive the fitted seal(s) and/or first flex circuit board(s) 514. For example, the fitted seal(s) can form a vacuum seal with the seal slot(s) while allowing first flex circuit board(s) 514 to pass through the seal slot(s) and into the vacuum chamber. In this way, flex circuit board(s) 506 can enter the vacuum chamber without experiencing signal disruptions from breaks in the circuit boards, as the boards can continuously pass into the vacuum chamber. In some embodiments, hermetic seal 552 can include fastening systems to secure the fitted seals to the seal slots and/or form a vacuum seal, such as, for example, screws, bolts, seal rings, O rings, etc. In some embodiments, hermetic seal 552 can form a vacuum seal without requiring adhesive material (e.g., glue, resin, etc.) such that, for example, residual adhesive material does not contaminate flex circuit board(s) 506.

First flex circuit board(s) 514 can be coupled to at least one second flex circuit board(s) 516. First flex circuit board(s) 514 can be coupled to second flex circuit board(s) 516 by at least one flex-flex interconnect 534. For instance, flex-flex interconnect(s) 534 can couple (structurally and/or electrically) the ground layer(s), dielectric layer(s), and/or signal line(s) of a first flex circuit board 514 to a second flex circuit board 516. As examples, flex-flex interconnect(s) 534 can be formed by soldering, welding, and/or otherwise fusing components of a first flex circuit board 514 to a second flex circuit board 516. Flex-flex interconnect(s) 534 can be or can include any suitable interconnection of two flex circuit board(s) 506 such as, for example, a butt joint, an overlap joint, and/or any other suitable interconnection(s).

The second flex circuit board(s) 516 can have at least a different material composition from the first flex circuit board(s) 514. In some embodiments, second flex circuit board(s) 516 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, second flex circuit board(s) 516 can include copper alloy signal lines and/or ground layer(s) to provide reduced thermal conductivity from the upper portions of the vacuum chamber (e.g., first circuit boards 514) and/or dispelling heat produced at subsequent components, such as surface mount attenuators 554.

In some embodiments, second flex circuit board(s) 516 can be coupled to at least one surface mount attenuator board 518. For instance, second flex circuit board(s) 516 can be coupled to surface mount attenuator board(s) 518 by at least one flex-flex interconnect 536. For instance, flex-flex interconnect(s) 536 can couple (structurally and/or electrically) the ground layer(s), dielectric layer(s), and/or signal line(s) of a second flex circuit board 516 to a surface mount attenuator board 518. As examples, the flex-flex interconnect(s) 536 can be formed by soldering, welding, and/or otherwise fusing components of a second flex circuit board 516 to a surface mount attenuator board 518. Flex-flex interconnect(s) 536 can be or can include any suitable interconnection of two flex circuit board(s) 506 such as, for example, a butt joint, an overlap joint, and/or any other suitable interconnection(s).

Surface mount attenuator board 518 can be a flexible printed circuit board. In some embodiments, the surface mount attenuator board(s) 518 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

Surface mount attenuator board(s) 518 can include one or more surface mount attenuators 554. Surface mount attenuator(s) 554 can be configured to attenuate or block thermal photon interference. In some embodiments, surface mount attenuator board(s) 518 and/or surface mount attenuator(s) 554 can be placed at a temperature cold enough such that the surface mount attenuator(s) 554 do not produce thermal photons. In some embodiments, surface mount attenuator(s) 554 can be disposed in an isolation plate. The isolation plate can be configured to isolate the one or more surface mount attenuators 554. The isolation plate can be attached to surface mount attenuator board(s) 518. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block crosstalk between attenuators.

Quantum computing system 500 can include at least one third flex circuit board 520. For instance, the surface mount attenuator board(s) 518 can be coupled to the third flex circuit board(s) 520 by at least one flex-flex interconnect 538. For instance, flex-flex interconnect(s) 538 can couple (structurally and/or electrically) the ground layer(s), dielectric layer(s), and/or signal line(s) of a surface mount attenuator board 518 to a third flex circuit board 520. As examples, flex-flex interconnect(s) 538 can be formed by soldering, welding, and/or otherwise fusing components of a surface mount attenuator board 518 to a third flex circuit board 520. Flex-flex interconnect(s) 538 can be or can include any suitable interconnection of two flex circuit board(s) 506 such as, for example, a butt joint, an overlap joint, and/or any other suitable interconnection(s).

Third flex circuit board(s) 520 can be positioned at a point in the vacuum chamber at which the cooling gradient is cool enough such that some materials exhibit superconductivity. For example, at least a portion of third flex circuit board(s) 520 can have a temperature of less than about three Kelvin.

In some embodiments, third flex circuit board(s) 520 can be or can include a third flex circuit board material at the ground layer(s) and/or the signal line(s). Third flex circuit board(s) 520 material can be selected to be superconducting at a temperature which at least a portion of third flex circuit board(s) 520 experience superconductivity. As examples, third flex circuit board(s) 520 material can be or can include niobium, tin, aluminum, and/or other suitable superconducting materials. For instance, third flex circuit board(s) 520 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 520 can be coupled to at least one fourth flex circuit board 522. Third flex circuit board(s) 520 can be coupled to the fourth flex circuit board(s) 522 by at least one flex-flex interconnect 540. For instance, flex-flex interconnect(s) 540 can couple (structurally and/or electrically) the ground layer(s), dielectric layer(s), and/or signal line(s) of a third flex circuit board 520 to a fourth flex circuit board 522. As examples, flex-flex interconnect(s) 540 can be formed by soldering, welding, and/or otherwise fusing components of a third flex circuit board 520 to a fourth flex circuit board 522. Flex-flex interconnect(s) 540 can be or can include any suitable interconnection of two flex circuit board(s) 506 such as, for example, a butt joint, an overlap joint, and/or any other suitable interconnection(s).

Fourth flex circuit board(s) 522 can couple third flex circuit board(s) 520 to the quantum hardware 504. For example, a connector 542 at an end of fourth flex circuit board(s) 522 can attach to a port that is in signal communication with quantum hardware 504. As one example, the connector can be a T-joint connector, such as a T-joint connector including superconducting materials (e.g., tin). Additionally and/or alternatively, connector 542 may be a planar spring array.

In some embodiments, fourth flex circuit board(s) 522 can be or can include a fourth flex circuit board material at the ground layer(s) and/or the signal line(s). Fourth flex circuit board(s) 522 material can be selected to provide high signal transfer performance characteristics. As examples, fourth flex circuit board(s) 522 material can be or can include copper, brass, gold, and/or other suitable materials having high signal transfer performance characteristics. For instance, fourth flex circuit board(s) 522 can include copper signal lines and/or ground layer(s) to provide high signal transfer performance characteristics. Additionally and/or alternatively, fourth flex circuit board(s) 522 material can be selected to be superconducting at temperatures which at least a portion of fourth flex circuit board(s) 522 experience superconductivity. As examples, fourth flex circuit board(s) 522 material can be or can include niobium, tin, aluminum, and/or other suitable superconducting materials.

In some embodiments, fourth flex circuit board(s) 522 can be or can include a filter 556, such as an XYZ and/or IR filter 556. For instance, filter 556 can be configured to reduce effects of noise, thermal photons, and/or other potential sources of interference. As one example, filter 556 can include a cavity in fourth flex circuit board(s) 522 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, filter 556 can be bounded by one or more boundaries of a cavity within fourth flex circuit board(s) 522 (e.g., a cavity within the dielectric material). For instance, a cavity within fourth flex circuit board(s) 522 can be filled with a filter material (e.g., a magnetically loaded polymer). In some embodiments, the cavity can be filled (e.g., partially or completely) with filter material via an access within fourth flex circuit board(s) 522 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

In an example, control pulses may be transmitted over one or more signal lines. (e.g., signal line(s) 124, 134) For example, a control pulse can be transmitted by one or more classical processors coupled to the signal line(s). The control pulse can be or can include classical (e.g., binary) computer-readable signal data, such as a voltage signal, and/or signals that are implementable by quantum computing devices.

In an example, a control pulse is transmitted to one or more quantum computing devices via signal line(s) For example, the control pulse can be transmitted, by the signal line(s), through a plurality of cryogenic cooling stages. For instance, signal line(s) carrying the control pulse can be progressively decreasing in temperature from the classical processor(s) (e.g., at room temperature and/or a temperature on the order of about 100 Kelvin) to the quantum computing device(s) (e.g., at a temperature of less than about 1 Kelvin, such as about 10 mK) and through a plurality of cryogenic cooling stages.

In an example, a control pulse may be applied to perform at least one quantum operation based at least in part on a control pulse. As one example, in some embodiments, quantum operation(s) can be or can include obtaining state measurement(s) of the quantum computing device(s). For instance, a control pulse can instruct the quantum computing device(s) to measure a quantum state and/or resolve the quantum state to a basis state representation. Additionally, the measured quantum state can be transmitted (e.g., by signal lines) to the classical processor(s).

As another example, in some embodiments, the quantum operation(s) can be or can include implementing at least one quantum gate operation by and/or at the quantum computing device(s). For instance, the control pulse can be descriptive of microwave pulses that are applied to the quantum computing device(s) (e.g., qubits) to perform quantum gating operations. Example quantum gating operations include, but are not limited to, Hadamard gates, controlled-NOT (CNOT) gates, controlled-phase gates, T gates, multi-qubit quantum gates, coupler quantum gates, etc.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this disclosure can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" generally refers to digital and/or quantum data processing hardware and encompasses all kinds of apparatuses, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., Quantum Computation Language (QCL), Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of such that in operation cause the system to perform the operations or actions. For one or more digital and/or quantum computer programs to be configured to perform particular operations or actions means that the one or more programs include instructions that, when executed by digital and/or quantum data processing apparatuses, cause such apparatuses to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this disclosure contains many example implementation details, these should not be construed as limitations on the scope of what may be claimed, but rather as descriptions of features that may be specific to particular implementations. Certain features that are described in examples of this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An interconnection for connecting a plurality of flex circuit boards, comprising:
   a first flex circuit board comprising a first ground plane, a first dielectric layer, a first set of one or more signal lines, a second dielectric layer, and a second ground plane, the first flex circuit board having a removed portion exposing at least one signal line in the first set of one or more signal lines;

a second flex circuit board comprising a third ground plane, a third dielectric layer, a second set of one or more signal lines, a fourth dielectric layer, and a fourth ground plane, the second flex circuit board having a removed portion exposing at least one signal line in the second set of one or more signal lines, and the removed portion of the first flex circuit board and the removed portion of the second flex circuit board being aligned forming a signal trace gap having a first surface;

a solder bridge coupling the at least one signal line in the first set of one or more signal lines and the at least one signal line in the second set of one or more signal lines, the solder bridge being disposed within the signal trace gap; and an isolation plate at least partially covering the signal trace gap such that the solder bridge is disposed between the isolation plate and the first surface of the signal trace gap, the isolation plate being coupled to at least one of the first ground plane of the first flex circuit board and the third ground plane of the second flex circuit board.

2. The interconnection of claim 1, further comprising:
a ground support layer extending at least partially across the second ground plane of the first flex circuit board and at least partially across the fourth ground plane of the second flex circuit board, the ground support layer being coupled to the second ground plane and the fourth ground plane.

3. The interconnection of claim 1, wherein an edge of the removed portion of the first flex circuit board and an edge of the removed portion of the second flex circuit board are in contact with one another.

4. The interconnection of claim 1, wherein one or more of the first ground plane, the second ground plane, the third ground plane, or the fourth ground plane comprises at least one superconductive material that is superconducting at temperatures less than about 1 Kelvin.

5. The interconnection of claim 1, wherein the at least one signal line in the first set of one or more signal lines and the at least one signal line in the second set of one or more signal lines are disposed on the first surface of the signal trace gap.

6. An interconnection for connecting a plurality of circuit boards, comprising:
a first circuit board comprising a first ground plane, a first dielectric layer, a first set of one or more signal lines, a second dielectric layer, and a second ground plane, the first circuit board having a removed portion exposing at least one signal line in the first set of one or more signal lines;

a second circuit board comprising a third ground plane, a third dielectric layer, a second set of one or more signal lines, a fourth dielectric layer, and a fourth ground plane, the second circuit board having a removed portion exposing at least one signal line in the second set of one or more signal lines, and the removed portion of the first circuit board and the removed portion of the second circuit board being aligned forming a signal trace gap have a first surface;

a solder bridge coupling the at least one signal line in the first set of one or more signal lines and the at least one signal line in the second set of one or more signal lines, the solder bridge being disposed within the signal trace gap;

an isolation plate at least partially covering the signal trace gap such that the solder bridge is disposed between the isolation plate and the first surface of the signal trace gap; and a ground support layer extending at least partially across the second ground plane of the first circuit board and at least partially across the fourth ground plane of the second circuit board, the ground support layer being coupled to the second ground plane and the fourth ground plane by a set of one or more solder connections.

7. The interconnection of claim 6, wherein the isolation plate is coupled to at least one of the first ground plane of the first circuit board and the third ground plane of the second circuit board.

8. The interconnection of claim 6, wherein the isolation plate is coupled to at least one of the first ground plane of the first circuit board and the third ground plane of the second circuit board by a set of one or more solder connections.

9. The interconnection of claim 6, wherein an edge of the removed portion of the first circuit board and an edge of the removed portion of the second circuit board are in contact.

10. The interconnection of claim 9, wherein the at least one signal line in the first set of signal lines and the at least one signal line in the second set of signal lines are in contact.

11. The interconnection of claim 6, wherein at least one of the first circuit board and the second circuit board is a flex circuit boards.

12. The interconnection of claim 6, wherein each ground plane of the first circuit board and each ground plane of the second circuit board is comprised of at least one superconductive material that is superconducting at a temperature less than about 3 Kelvin.

13. The interconnection of claim 6, wherein the first circuit board and the second circuit board are flex circuit boards, and each ground plane of the first circuit board and each ground plane of the second circuit board is comprised of at least one superconductive material that is superconducting at a temperature less than about 3 Kelvin.

14. The interconnection of claim 6 wherein the at least one signal line in the first set of one or more signal lines and the at least one signal line in the second set of one or more signal lines are disposed on the first surface of the signal trace gap.

15. A method for producing a wiring structure for a quantum computing system, comprising:
obtaining a first flex circuit board comprising a first ground plane, a first dielectric layer, a first set of one or more signal lines, a second dielectric layer, and a second ground plane;

obtaining a second flex circuit board comprising a third ground plane, a third dielectric layer, a second set of one or more signal lines, a fourth dielectric layer, and a fourth ground plane;

removing a portion of the first flex circuit board, thereby creating a removed portion of the first flex circuit board exposing at least one signal line in the first set of signal lines;

removing a portion of the second flex circuit board, thereby creating a removed portion of the second flex circuit board exposing at least one signal line in the second set of signal lines;

aligning the removed portion of the first flex circuit board and the removed portion of the second flex circuit board, thereby forming a signal trace gap having a first surface;

coupling the at least one signal line in the first set of one or more signal lines and the at least one signal line in the second set of one or more signal lines at the signal trace gap via a solder bridge; and coupling an isolation plate to the wiring structure such that the isolation plate at least partially covers the signal trace gap and the solder bridge is disposed between the isolation plate and the first surface of the signal trace gap.

16. The method of claim 15, further comprising:
coupling a ground support layer extending at least partially across the second ground plane of the first flex circuit board and at least partially across the fourth ground plane of the second flex circuit board, the ground support layer being coupled to the second ground plane and the fourth ground plane each by a set of one or more solder connections.

17. The method of claim 15, wherein coupling the isolation plate to the wiring structure comprises:
coupling the isolation plate to at least one of the first ground plane of the first flex circuit board and the third ground plane of the second flex circuit board.

18. The method of claim 15, wherein the isolation plate is coupled to each of the first ground plane of the first flex circuit board and the third ground plane of the second flex circuit board respectively by a set of one or more solder connections.

19. The method of claim 15, wherein the removing of the portion of the first flex circuit board or the removing of the portion of the second flex circuit board comprises ablating the respective flex circuit board.

20. The method of claim 15, wherein an edge of the removed portion of the first flex circuit board and an edge of the removed portion of the second flex circuit board are in contact with one another.

21. The method of claim 15, wherein the solder bridge is comprised of at least one superconductive material.

22. The method of claim 15, wherein one or more of the ground planes are comprised of at least one superconductive material that is superconducting at a temperature less than about 3 Kelvin.

23. The method of claim 15 wherein the at least one signal line in the first set of one or more signal lines and the at least one signal line in the second set of one or more signal lines are disposed on the first surface of the signal trace gap.

* * * * *